United States Patent [19]
Dedert et al.

[11] Patent Number: 5,844,308
[45] Date of Patent: Dec. 1, 1998

[54] INTEGRATED CIRCUIT ANTI-BRIDGING LEADS DESIGN

[75] Inventors: Ronald J. Dedert, Geneva; William A. Hollinger, Jr., Monroe; Paul J. Kaverman, Geneva, all of Ind.

[73] Assignee: CTS Corporation, Elkhart, Ind.

[21] Appl. No.: 915,268

[22] Filed: Aug. 20, 1997

[51] Int. Cl.[6] .................................................. H01L 23/48
[52] U.S. Cl. ........................ 257/692; 257/696; 257/779
[58] Field of Search .................................. 257/678, 787, 257/656, 692, 666, 779

[56] References Cited

U.S. PATENT DOCUMENTS

| | | |
|---|---|---|
| 4,204,317 | 5/1980 | Winn . |
| 4,289,568 | 9/1981 | Trotsky et al. . |
| 5,057,456 | 10/1991 | Dehaine . |
| 5,098,863 | 3/1992 | Dolezal et al. . |
| 5,136,122 | 8/1992 | Kwitkowski et al. . |
| 5,147,084 | 9/1992 | Behun et al. . |
| 5,196,268 | 3/1993 | Fritz . |
| 5,210,375 | 5/1993 | Long . |
| 5,387,486 | 2/1995 | Emmelius et al. . |
| 5,495,669 | 3/1996 | Lagrady et al. . |
| 5,569,880 | 10/1996 | Galvagni et al. . |

FOREIGN PATENT DOCUMENTS 4-318959  11/1992  Japan ........................................ 257/696

*Primary Examiner*—Peter Toby Brown
*Assistant Examiner*—Roy Potter
*Attorney, Agent, or Firm*—Michael W. Starkweather; Daniel Tychonevich

[57] ABSTRACT

An IC package design and method of making the package design that provides anti-bridging between metal leads. The anti-bridge IC package design extends bottom covercoat material out onto the leads a sufficient distance to prevent solder bridging that typically takes place in cup regions of gull wing shaped leads. A further feature of the invention is to provide a method of applying covercoat material to the IC and the leads in the same process step. A resilient material wheel and related manufacturing equipment is used to apply a single covercoat material, like epoxy, in a single step that serves as both the bottom covercoat and lead anti-bridge coat for the IC.

12 Claims, 3 Drawing Sheets

INTEGRATED CIRCUIT ANTI-BRIDGING LEADS DESIGN

BACKGROUND OF THE INVENTION

1. Field of the Invention

This invention relates to integrated circuit (IC) packaging. In particular, it provides an IC package, including resistor networks, design and method of applying the package design so that electrical bridging between metal leads caused by wave soldering operations is reduced.

2. Description of the Related Art

Various devices and methods of dealing with the delicate complexities of IC leads are legion. Examples of patents related to the present invention are as follows, and each patent is herein incorporated by reference for the supporting teachings:

U.S. Pat. No. 5,569,880 is a surface mountable electronic component and method of making the same.

U.S. Pat. No. 5,495,669 is a method of making box contacts.

U.S. Pat. No. 5,387,486 is a radiation-polymerizable mixture and process for producing a solder resist mask.

U.S. Pat. No. 5,210,375 is an electronic device package-carrier assembly ready to be mounted onto a substrate.

U.S. Pat. No. 5,147,084 is an interconnection structure and test method.

U.S. Pat. No. 5,136,122 is a braided fiber omega connector.

U.S. Pat. No. 5,196,268 is an integrated circuit interconnect leads releasably mounted on film.

U.S. Pat. No. 5,098,863 is a method of stabilizing lead dimensions on high pin count surface mount IC packages.

U.S. Pat. No. 5,057,456 is a method of manufacturing a tab semiconductor package by securing a thin insulating frame to inner leads of the package.

U.S. Pat. No. 4,289,568 is an apparatus for automated application of heat sensitive tape.

U.S. Pat. No. 4,204,317 is a method of making a lead frame.

The foregoing patents reflect the state of the art of which the applicant is aware and are tendered with the view toward discharging applicants' acknowledged duty of candor in disclosing information that may be pertinent in the examination of this application. It is respectfully stipulated, however, that none of these patents teach or render obvious, singly or when considered in combination, applicant's claimed invention.

3. Problem with the Related Art

A common problem occurring during PCB population occurs during wave soldering of the ICs to the POB. Typically ICs are temporarily mounted, via glue, for example, to the PCB. The PCB is then positioned upside down and run through a wave solder. The wave solder typically will completely submerge the ICs. Any metal surfaces exposed to the solder will be coated with a thin layer of solder. However, because of the shape of metal leads, in particular "gull wing" designs, solder will pool up on the horizontal regions. The lateral surfaces can collect enough solder to actually form a bridge between adjacent leads, thereby shorting out the circuit and creating a defective PCB. Therefore, there was a need for an IC package that has an anti-bridge design.

FIG. 1, illustrates one solution for an anti-bridge design. In particular, the IC 10, has electrical circuitry 12 mounted thereon. Gull wing leads 14, are embedded into the IC body 16, and are coupled to the circuitry 12 via conductors 18 in a known fashion. The IC 10 is mounted to a printed circuit board 20, having bond pads 22, and electrical components or traces 24 thereon. Insulatable material 30, like epoxy, covers at least one side of IC 10 to insulate the circuitry 12 from traces 24. Material 30 is added to prevent bridging between electrical components or traces 24 and circuitry 12 during wave soldering operations. It is noted that the insulatable material is applied to the IC body 16 when the leads are in an unbent or straight condition. Ultraviolet curable material 40, like polyurathane, is formed in cup region 15 of a gull wing lead design. The UV material 40 is added after the leads have been formed into the gull wing design. This two step two material covercoat has proved successful in eliminating the bridging of solder 25 in the gull wing cup regions 15 as a result of subsequent wave soldering operations. However, it is an expensive and duplicative process of applying and curing insulatable material 30 before applying and curing the gull wing cup UV material 40 after the gull wing leads have been formed. Therefore, a need exists for an IC that has anti-bridging capabilities that can be applied in a single process step.

SUMMARY OF THE INVENTION

It is a feature of the invention to provide an integrated circuit (IC) packaging. In particular, it provides an IC package design and method of applying the package design to an IC that provides for anti-bridging between metal leads because of PCB wave soldering operations.

An additional feature of the invention is to provide an anti-bridge IC package design that extends a typical bottom cover coat out onto the leads sufficient to prevent solder pooling located in cup regions of gull wing shaped leads.

A further feature of the invention is to provide a method of applying covercoat material to the IC and the leads in the same process step.

Yet, another feature of the invention is to provide a resilient material wheel and related manufacturing equipment that apply a single material, like epoxy, in a single step that serves as both the bottom covercoat and lead anti-bridge coat for the IC.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

FIG. 4b illustrates a side view of FIG. 4a.

Figure 1:
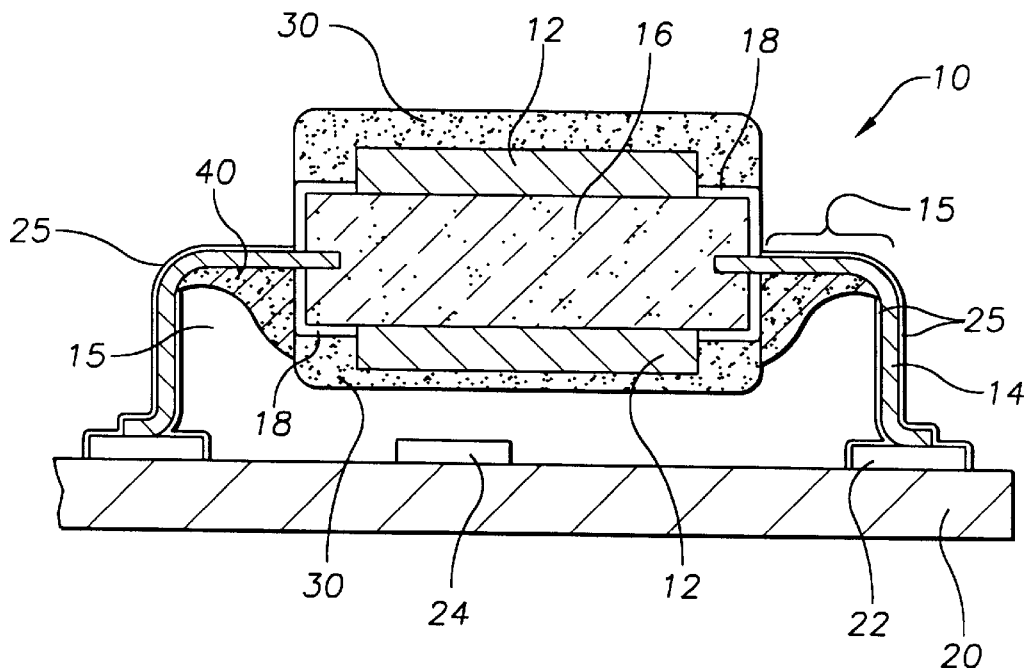
FIG. 1 is a cross section of a related art IC employing two separate coating materials mounted to a PCB.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements between the drawings.

DETAILED DESCRIPTION OF THE PREFERRED EMBODIMENT

Figure 2:
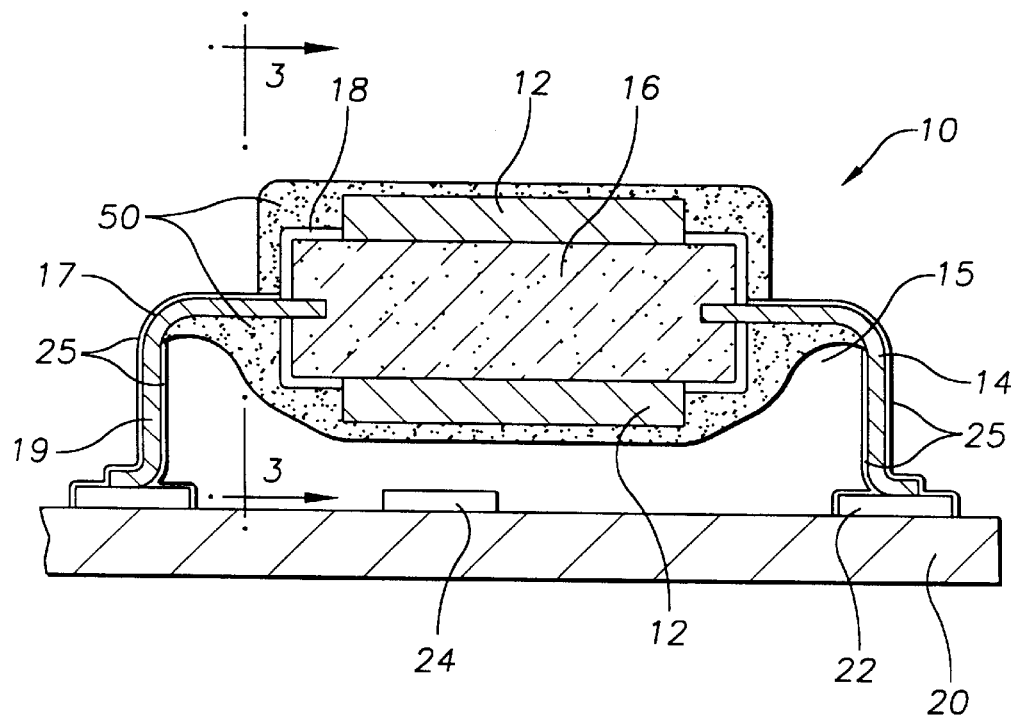
FIG. 2 is a cross section of a preferred IC embodiment employing one coating material mounted to a PCB.

The present invention provides an integrated circuit anti-bridging leads design. 20 Regarding FIG. 2, there is a preferred embodiment IC 10 with an anti-bridge design. In particular, the IC 10, has electrical circuitry 12 mounted thereon. Gull wing leads 14, are embedded into IC body 16 which is a ceramic based material, are bent at a first bend 17 and a second bend 19, and are coupled to circuitry 12 via conductors 18 in a known fashion. The IC 10 is mounted to a printed circuit board 20, having bond pads 22, and electrical components or traces 24 thereon. Insulatable material 50, like epoxy, formes a covercoat layer that covers at least a bottom side of the IC 10 to insulate the circuitry 12 from PCB traces/components 24. Additionally, cover coat 50 is also formed in cup region 15 of gull wing leads 14 to prevent solder bridging typically occurring during subsequent wave soldering operations. The cup region 15 extends from the outer surface of IC body 16 to a position beyond the bend 17 in the lead 14. Solder layer 25 covers all exposed solderable material, for example leads 14 and bond pads 22.

Figure 3:
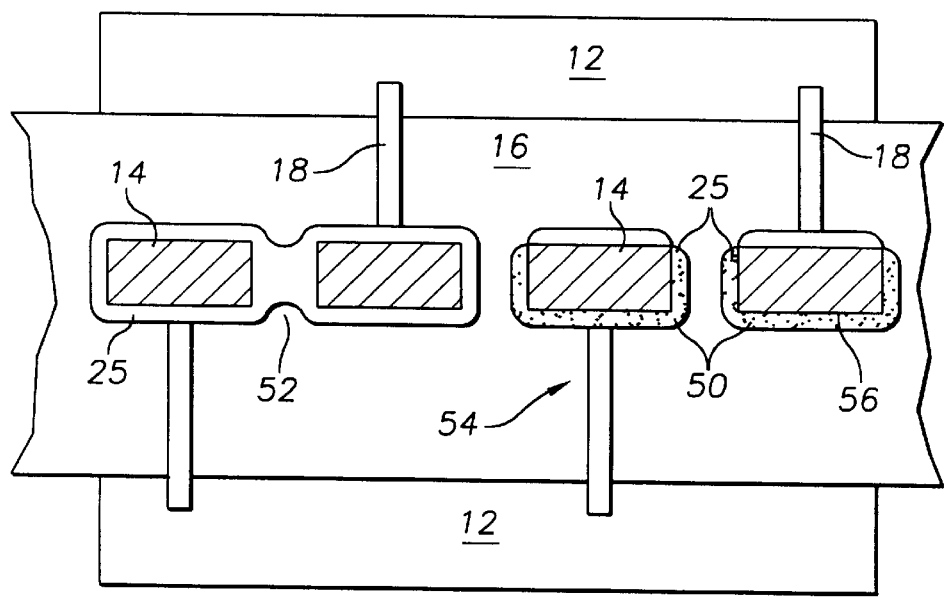
FIG. 3 is a cross sectional side view of the leads of the IC illustrating solder bridging and anti-bridging design effects.

Referring to FIG. 3, there is illustrated a sectional side view of leads 14 extending from body 16 that have been put through a wave soldering operation. In particular, there are two situations illustrated; the left two leads 14 have solder 25 forming a defect causing solder bridge 52. The second situation is illustrated by the two right leads 14, showing where bridging is avoided 54 because of the existence of a non-solderable covercoat layer 50 that at least covers the bottom side 56 of the leads.

Figure 4A:
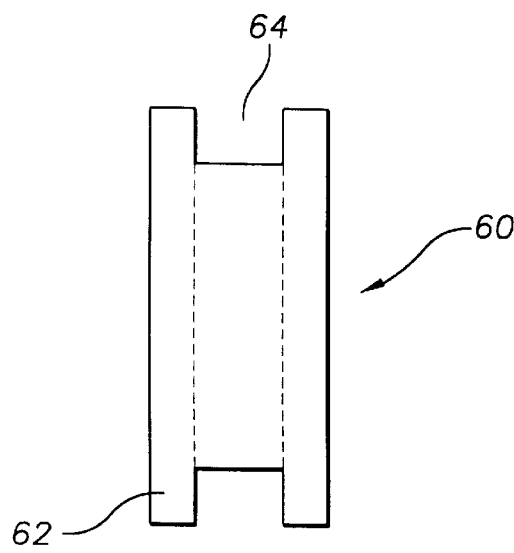
FIG. 4a illustrates an end view of a resilient material wheel employed to apply the cover coating material on the preferred embodiment.
Figure 4B:
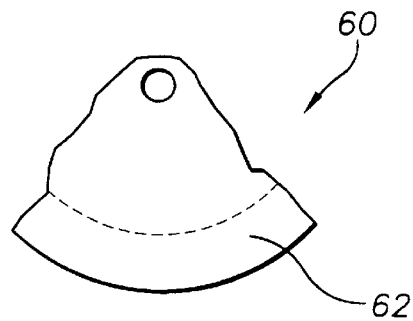
Figure 4C:
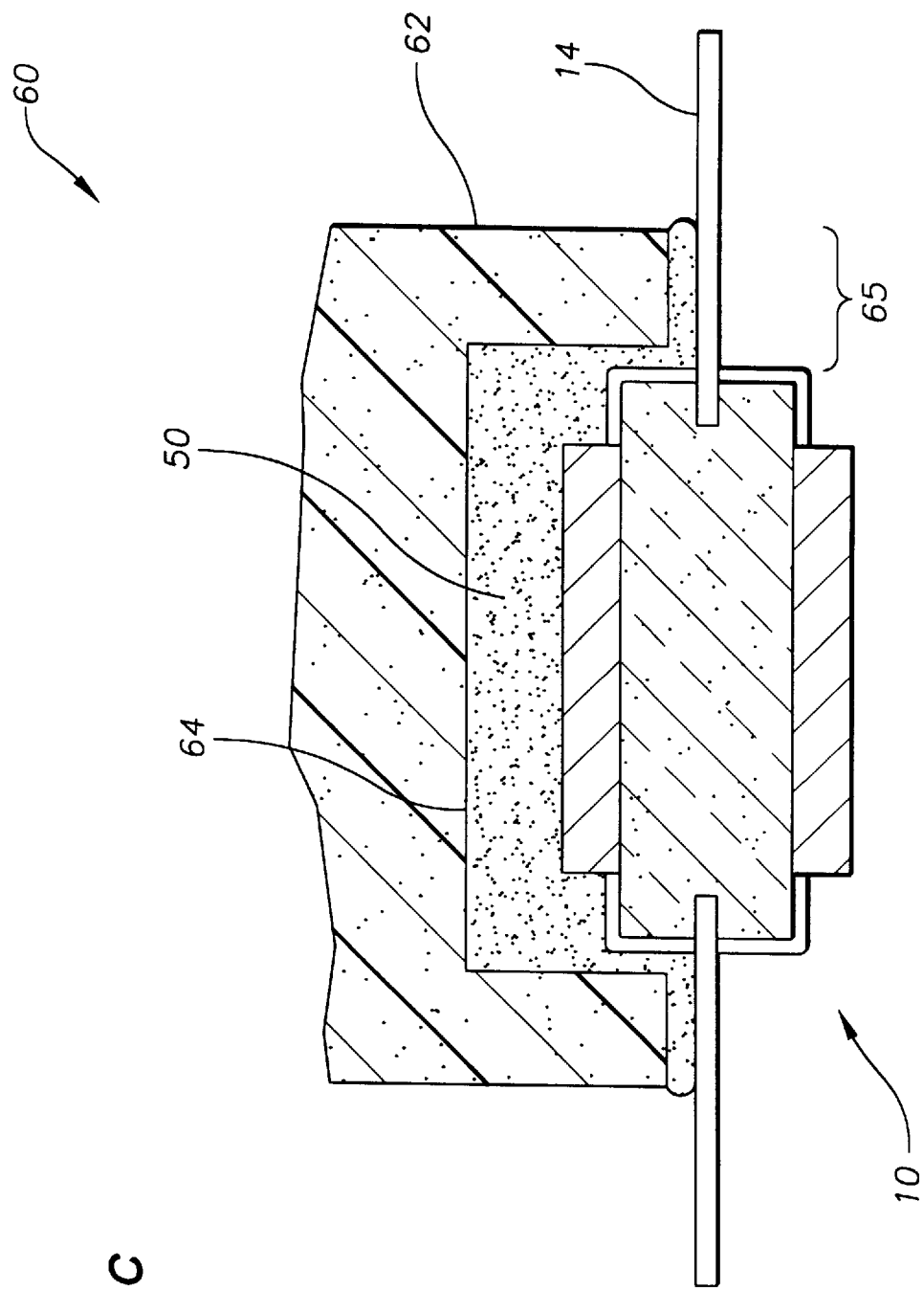
FIG. 4c illustrates an end view of a FIG. 4a as material is applied to an IC.

Referring to FIG. 4a, 4b, and 4c, there are views of an elastic material wheel 60 for applying cover coat material onto straight leads of an IC. In particular, wheel 60 has ridges 62, and channel 64 that applies epoxy 50 onto at least the bottom side of the first portion 65 of leads 14 and at least the bottom surface of IC 10.

The method of assembling an anti-bridge IC and thereby mounting it to a PCB is as follows: An IC body having circuitry and unbent leads mounted thereon is provided. The IC body may have subsequent circuitry 12 applied thereon. The IC is then run under the elastic material wheel 60 to simultaneously cover at least the bottom side of the IC and to also cover at least a bottom face of the first portion 65. Of course, the wheel 60 first is covered with covercoat material prior to coating the IC 10. Wheel 60 will receive ICs 10 so that the leads first portion 65 will be coated by ridge 62, channel 64 will cover the body 16, and the sides of the ridges will cover the sides of the body 16. The covercoat can then be hardened if needed. The straight leads are then formed into the gull wing leads illustrated in FIGS. 1 and 2. The ICs are then ready to be temporarily attach to bond pads 22 on a PCB 20 by gluing or any known method. The PCB is then placed upside down through a wave soldering operation, which completely submerges the mounted IC. The PCB is then removed from the wave soldering operation, where solder is maintained only on solderable material like the exposed surfaces of the leads and bond pads 22, as shown in FIG. 2.

Remarks About the Preferred Embodiment

One of ordinary skill in the art of designing and using ICs will realize many advantages from studying and using the preferred embodiment. For example, a single material and process step can now be used for both a cover coat and anti-bridge material.

It is important to note that the cover coat 50 should be extended beyond the first bend 17 in the metal leads to achieve effective anti-bridging protection. Additionally, it is noted that cover coat 50 may cover both the bottom and sides of leads 14 for increased anti-bridging and even the top side thereof. Although, it has been discovered that simply covering the bottom side of leads 14 will suffice.

It is noted that the preferred embodiment designs its circuitry 12 and traces 18 using unsolderable thick film material, which is used to make resistor networks. A skilled artisan will also realize that if the circuitry 12 and traces 18 are made of solderable material, then a cover coat 50 may be required thereon to prevent solder from forming thereon during wave soldering process steps, for example.

Additionally, it is well understood that the depending upon the amount of covercoat material located on the wheel 60, the covercoat material application can be controlled. In particular, covercoat material may only cover the bottom face 56 if a small amount of covercoat material is applied. It may be possible to additionally cover the side faces if more covercoat material is applied from the wheel. A thick layer of covercoat may even extend between adjacent leads if a large amount is applied, appearing like a solder bridge.

It is noted that both sides of leads 14 may be easily coated by using two wheels 60; one wheel on each side of the IC 10. In this fashion, both sides of the IC body 16 can also be covered.

Variations of the Preferred Embodiment

Although the illustrated embodiments discuss the arrangement of an IC using thick film for both the electronics 12 and the traces 18 mounted thereon, one skilled in the art will realize that the preferred embodiment would work with most any IC arrangement needing to avoid bridging problems.

An additional variation of the invention contemplates the use of applying any type of covercoat material that serves the purpose of 1) insulating IC electronics and 2) creating an anti-bridge on metal leads extending from the IC body.

Although the preferred embodiment depicts a certain shaped wheel 60, many variations are possible. For example, a very spongy material may work with gear teeth, which work to separate individual ICs as covercoat material 50 is applied thereto. In fact, one skilled in the art could conceive of a cover coat application tool that is not a wheel, but a stamp pad that is rewetted with covercoat material between stamping, or even spraying covercoat material onto the IC with directed micro spray nozzles.

Although, the preferred embodiment describes covering the bottom side of the IC 10 and leads 14 with a covercoat material, like epoxy, it is contemplated to cover only a top side of both parts, or any combination of sides thereof, depending upon the application.

The preferred embodiment describes placing epoxy 50 in the cup region that means extending from the body surface to a point just past the first bend 17. It is even contemplated that the epoxy will extend completely around the first bend and potentially all the way to the second bend 19. Additionally, it is expected that this method and design will work equally as well with other type of lead designs like "J" leads etc.

Eventhough the illustrated embodiment teaches placing electrical circuitry on both sides of the IC, it is contemplated that circuitry be placed only on the top side, or only on the bottom side.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed and desired to be secured by United States Patent is:

1. An electronic package, comprising:
   a) a body;
   b) circuitry mounted on the body;
   c) electrical leads, having: 1) a first end embedded into the body, and 2) a first bend close to the body;
   d) conductors mounted on the body electrically coupling the electrical leads to the circuitry; and
   e) a covercoat, consisting of a single material that covers at least a portion of: 1) the body, 2) the circuitry, 3) the conductors, and 4) the electrical leads to a position just past the first bend.

2. The electronic package of claim 1, wherein the electrical leads are gull wing leads having the covercoat covering all sides of the gull wing leads up to the position.

3. The electronic package of claim 2, wherein the circuitry is a resistor network mounted on a top side of the body, and the body is composed of a ceramic based material.

4. The electronic package according to claim 1, wherein the circuitry is disposed on two sides of the body.

5. An electronic package, comprising:
   a) an electronic package having:
      a1) a ceramic body having a pair of side surfaces and a top and bottom surface;
      a2) electrical circuitry mounted on the body;
      a3) bent leads, having one end embedded into the side surfaces, a first bend proximate the body, a cup region located between the side surfaces and the first bend, and a bottom side generally parallel to the bottom surface;
      a4) a plurality of conductors disposed on the body and electrically connecting the leads to the circuitry; and
      a5) a single insulative covercoat, covering at least the bottom surface, the circuitry, and at least the bottom side in the cup region; and
   b) bond pads, having another end of the leads mounted thereon.

6. The electronic package of claim 4, wherein the covercoat covers both sides of the leads and a substantial portion of the bend.

7. The electronic package of claim 6, wherein the electrical circuitry is a resistor network and the body is composed of ceramic material.

8. The electronic package according to claim 5, wherein the circuitry is disposed on both the top and bottom sides of the body.

9. A resistor network, comprising:
   a) a ceramic body having a first and a second surface;
   b) circuitry mounted on at least one surface of the body;
   c) electrical leads, including:
      c1) a first end embedded into the body; and
      c2) a first bend close to the body;
   d) conductors mounted on the body electrically connecting the electrical leads to the circuitry; and
   e) a covercoat that surrounds the body, the circuitry, the conductors and the electrical leads to a position extending to the first bend.

10. The electronic package according to claim 9, wherein the circuitry is disposed on both the first and second surfaces.

11. The electronic package according to claim 9, wherein the electrical lead further includes a second end connected to a bond pad on a printed circuit board.

12. The electronic package according to claim 9, wherein the circuitry is at least one resistor.

* * * * *